(12) United States Patent
Park et al.

(10) Patent No.: US 12,218,639 B2
(45) Date of Patent: Feb. 4, 2025

(54) INTERFACE CIRCUIT INCLUDING VARIABLE IMPEDANCE CIRCUIT AND OPERATING METHOD THEREOF

(71) Applicant: Samsung Electronics Co., Ltd., Suwon-si (KR)

(72) Inventors: Jiyeon Park, Suwon-si (KR); Kihwan Seong, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 423 days.

(21) Appl. No.: 17/588,617

(22) Filed: Jan. 31, 2022

(65) Prior Publication Data

US 2022/0286095 A1 Sep. 8, 2022

(30) Foreign Application Priority Data

Mar. 4, 2021 (KR) .................. 10-2021-0029082

(51) Int. Cl.
*H03F 1/56* (2006.01)
*H03F 3/45* (2006.01)

(52) U.S. Cl.
CPC ............ *H03F 1/56* (2013.01); *H03F 3/45179* (2013.01); *H03F 2203/45576* (2013.01)

(58) Field of Classification Search
CPC .............................. H03F 1/56; H03F 3/45179
See application file for complete search history.

(56) References Cited

U.S. PATENT DOCUMENTS

| | | | |
|---|---|---|---|
| 5,319,265 A | 6/1994 | Lim | |
| 5,408,694 A * | 4/1995 | Tran | H03G 3/344 |
| | | | 455/220 |
| 5,563,553 A * | 10/1996 | Jackson | H03K 3/0322 |
| | | | 331/34 |
| 7,042,271 B2 | 5/2006 | Chung et al. | |
| 8,335,249 B1 | 12/2012 | Su et al. | |
| 8,615,205 B2 | 12/2013 | Choksi et al. | |
| 9,054,902 B2 | 6/2015 | Song et al. | |
| 9,614,564 B2 | 4/2017 | Chang et al. | |
| 9,647,618 B1 * | 5/2017 | Yuan | H03F 3/45197 |
| 9,959,536 B1 | 5/2018 | Shivnaraine et al. | |
| 10,230,359 B1 | 3/2019 | Mattia et al. | |
| 10,305,462 B1 | 5/2019 | Wang et al. | |

(Continued)

FOREIGN PATENT DOCUMENTS

JP  4329032 B2  9/2009
KR  101203457 B1  11/2012

*Primary Examiner* — Patricia T Nguyen
(74) *Attorney, Agent, or Firm* — Myers Bigel, P.A.

(57) ABSTRACT

An interface circuit includes a first amplifier circuit comprising a first input terminal configured to receive a first input signal, a second input terminal configured to receive a second input signal, a first output node configured to output a first output signal, a second output node configured to output a second output signal, and a variable impedance circuit comprising a first impedance circuit connected to the first output node, and a second impedance circuit connected to the second output node. A code generator circuit is configured to generate a first control code and a second control code. The first impedance circuit is configured to adjust an impedance thereof based on the first control code, and the second impedance circuit is configured to adjust an impedance thereof based on the second control code.

20 Claims, 16 Drawing Sheets

(56) References Cited

U.S. PATENT DOCUMENTS

| | | | |
|---|---|---|---|
| 11,271,664 B1* | 3/2022 | Ngankem Ngankem | G01R 19/0053 |
| 2003/0193370 A1* | 10/2003 | Leifso | H03F 3/45179 |
| | | | 330/254 |
| 2005/0057315 A1* | 3/2005 | Groen | H03L 7/0995 |
| | | | 331/57 |
| 2009/0153214 A1* | 6/2009 | Takatori | H03L 7/0995 |
| | | | 327/262 |
| 2011/0028089 A1* | 2/2011 | Komori | H03F 3/195 |
| | | | 455/39 |
| 2012/0018622 A1 | 1/2012 | Sugimoto et al. | |
| 2016/0173098 A1* | 6/2016 | Jaffari | H03K 19/018528 |
| | | | 326/83 |
| 2019/0296756 A1* | 9/2019 | Ali | H03F 3/45237 |

* cited by examiner

INTERFACE CIRCUIT INCLUDING VARIABLE IMPEDANCE CIRCUIT AND OPERATING METHOD THEREOF

CROSS-REFERENCE TO RELATED APPLICATION

This application is based on and claims priority under 35 U.S.C. § 119 to Korean Patent Application No. 10-2021-0029082, filed on Mar. 4, 2021, in the Korean Intellectual Property Office, the disclosure of which is incorporated by reference herein in its entirety.

FIELD

The inventive concept relates to an interface circuit, and more particularly, to an interface circuit including a variable impedance circuit, and an operating method thereof.

BACKGROUND

As bandwidth of a memory interface increases, noise and interference may occur in signals received through a receiver. To remove noise, a hysteresis circuit, which is insensitive to noise, may be provided in the receiver. The hysteresis circuit may include a latch-type circuit, which may be limited in use because latch-type circuits can be vulnerable to changes in process, voltage and/or temperature (PVT). The receiver may change a duty ratio by adding or subtracting an offset to or from signals received through a pin. Further, the receiver may perform an equalization operation to compensate for inter-symbol interference of received signals.

However, a plurality of circuits may be required to perform operations of noise removal, change of duty ratio, and equalization, and because of the plurality of circuits, the receiver may have an increased size and a lower degree of integration.

SUMMARY

The inventive concept provides an interface circuit configured to selectively perform a plurality of operations through the same structure, and an operating method of the interface circuit.

According to an aspect of the inventive concept, there is provided an interface circuit including a first amplifier circuit having a first input terminal configured to receive a first input signal, a second input terminal configured to receive a second input signal, a first output node configured to output a first output signal, a second output node configured to output a second output signal, and a variable impedance circuit comprising a first impedance circuit connected to the first output node, and a second impedance circuit connected to the second output node; and a code generator circuit configured to generate a first control code and a second control code, wherein the first impedance circuit is configured to adjust an impedance thereof based on the first control code, the second impedance circuit is configured to adjust an impedance thereof based on the second control code.

According to another aspect of the inventive concept, there is provided an interface circuit including a first amplifier comprising an impedance circuit configured to receive a first input signal and a second input signal, and to output a first output signal and a second output signal; a second amplifier configured to receive the first output signal and the second output signal, and to output a third output signal; a third amplifier configured to receive the third output signal, and to output a fourth output signal and a fifth output signal; a code generator circuit configured to generate a control code to adjust an impedance of the impedance circuit; and a selection circuit configured to select one of the fourth output signal, the fifth output signal, or an error voltage control signal, and provide the one of the fourth output signal, the fifth output signal, or the error voltage control signal that was selected to the code generator circuit.

According to another aspect of the inventive concept, there is provided an operating method of an interface circuit including receiving a mode selection signal indicating one of a plurality of operation modes; selecting one of a first output signal, a second output signal, or an error voltage control signal according to the one of the plurality of operation modes indicated by the mode selection signal; adjusting an impedance connected to an output terminal of a first amplifier based on the one of the first output signal, the second output signal, or the error voltage control signal that was selected; and generating an output signal of the first amplifier based on the impedance that was adjusted.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Hereinafter, various embodiments of the inventive concept are described with reference to the accompanying drawings.

Figure 1:
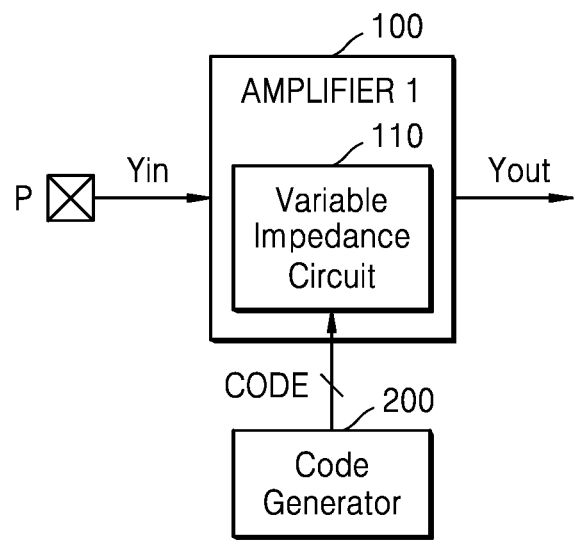
FIG. 1 is a block diagram illustrating an interface circuit according to an example embodiment.

FIG. 1 is a block diagram illustrating an interface circuit according to an example embodiment.

Referring to FIG. 1, an interface circuit 10 may receive an input signal Yin and output an output signal Yout. The interface circuit 10 may be a receiver circuit, and the receiver circuit may receive the input signal Yin through a pin P and output the output signal Yout. The interface circuit 10 may be a receiver RX included in a memory interface and may be connected to an external device through the pin P. The interface circuit 10 may perform a noise removal operation on the output signal Yout received through the pin P, an error voltage correction operation on the output signal Yout, or an equalization operation on the output signal Yout.

The interface circuit 10 may include a first amplifier 100 and a code generator 200. The first amplifier 100 may receive the input signal Yin, output the output signal Yout, and perform the noise removal operation, the error voltage correction operation, and the equalization operation. In some embodiments, the first amplifier 100 may be a differential amplifier. Specifically, the first amplifier 100 may generate the output signal Yout based on the input signal Yin received through the pin P and a reference voltage signal ref voltage generated by the interface circuit 10. In some embodiments, the first amplifier 100 may generate the output signal Yout based on the input signal Yin received through the pin P and an input signal received through another pin. The first amplifier 100 may include a variable impedance circuit 110. The variable impedance circuit 110 may have impedance which varies based on a control code. The variable impedance circuit 110 may be connected to an output node where the output signal Yout is output. With the impedance varying based on the control code, a plurality of operations regarding the output signal Yout may be performed. The variable impedance circuit 110 may include a plurality of transistors connected in parallel, and each of the plurality of transistors may be switched according to the control code. The noise removal operation may be described with reference to FIGS. 4 to 6, the error voltage correction operation may be described with reference to FIGS. 7 to 9, and the equalization operation may be described with reference to FIGS. 10 and 11.

The code generator 200 may generate different control codes CODE for the first amplifier 100 to perform a plurality of operations. The impedance of the variable impedance circuit 110 may be different for each operation. Specifically, transistors to be switched among the plurality of transistors included in the variable impedance circuit 110 may be different for each operation.

The interface circuit 10 according to an example embodiment may perform a plurality of operations using a single circuit by controlling the variable impedance circuit 110 to have different impedances for each operation. Accordingly, the interface circuit 10 according to an example embodiment may not have separate circuits for each operation, and thus provide improved degree of integration and lower power consumption.

Figure 2:
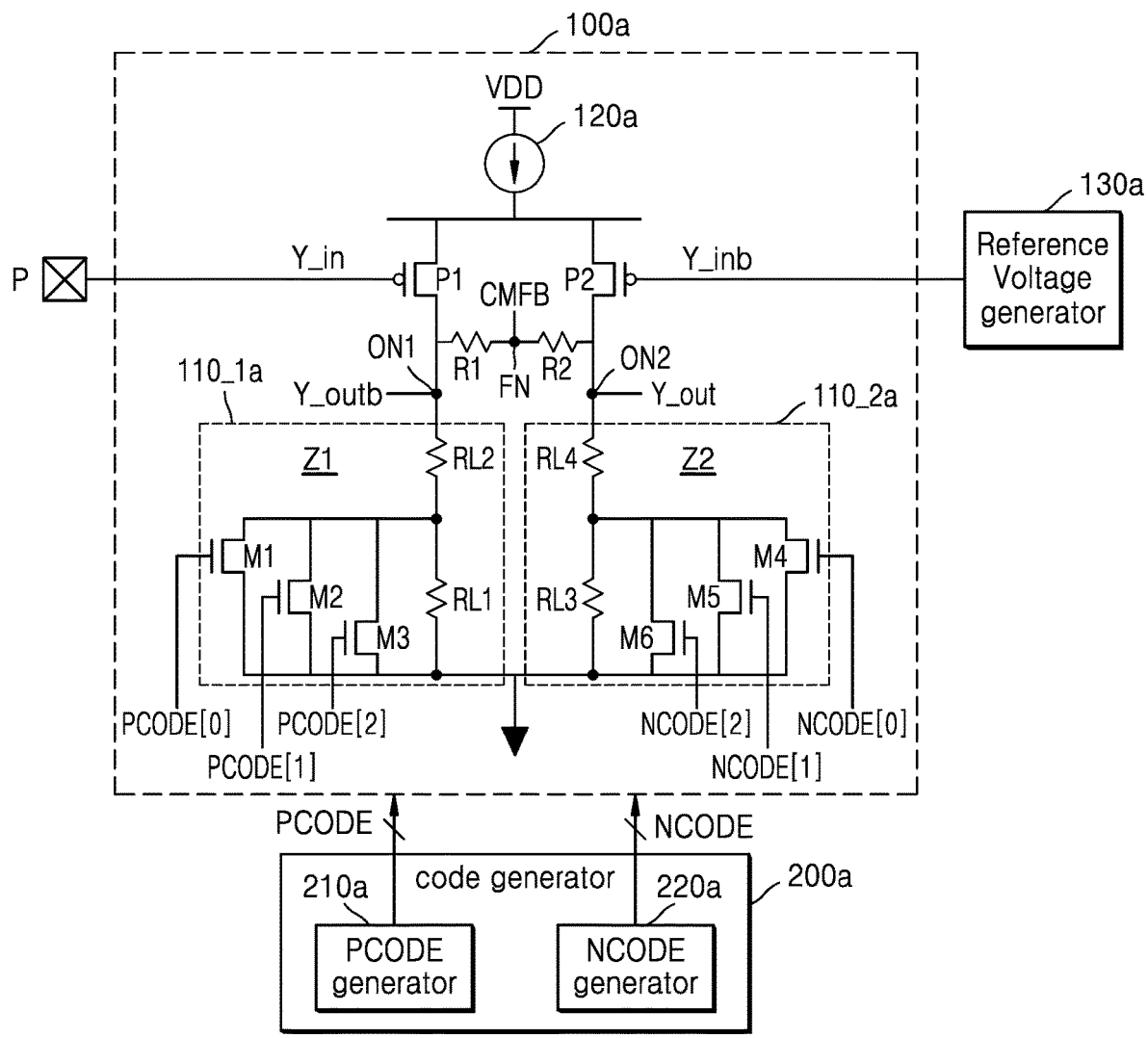
FIG. 2 is a circuit diagram illustrating an interface circuit according to an example embodiment.

FIG. 2 is a circuit diagram illustrating an interface circuit according to an example embodiment.

With reference to FIG. 2, an interface circuit 10a may include a first amplifier 100a, a code generator 200a, and a reference voltage generator 130a. The first amplifier 100a may be a differential amplifier. That is, a first output signal Y_out and a second output signal Y_outb may be generated based on a difference between a first input signal Y_in and a second input signal Y_inb. The terms "first," "second," etc. may be used herein merely to distinguish one element or signal from another. The first output signal Y_out may be a voltage of a second output node ON2, and the second output signal Y_outb may be a voltage of a first output node ON1.

The interface circuit 10a may be a receiver circuit configured to receive the first input signal Y_in from the pin P. The first amplifier 100a may receive the first input signal Y_in from the pin P and receive the second input signal Y_inb from the reference voltage generator 130a. In some embodiments, the first amplifier 100a may receive the second input signal Y_inb from a separate pin (e.g., P'). The first amplifier 100a may include a first input transistor P1 configured to receive the first input signal Y_in through a gate terminal, and a second input transistor P2 configured to receive the second input signal Y_inb through a gate terminal. In some embodiments, the first input transistor P1 and the second input transistor P2 may be a P-type transistor. In this specification, transistors may have or include any structure or types of transistors. For example, transistors may include a fin field effect transistor (FinFET) formed of active patterns extending in the form of a fin, and gate electrodes. The transistors may include a multi-bridge channel FET (MBCFET) formed of multiple nanosheets extending parallel to each other and gate electrodes. The transistors may include a ForkFET including nanosheets for P-type transistors and nanosheets for N-type transistors, which are separated into dielectric walls, allowing N-type transistors and P-type transistors to have a closer structure. The transistors may include a vertical FET (VFET) which includes source/drain areas spaced apart from each other in a vertical direction (e.g., in the Z-axis direction) relative to a substrate, and a gate electrode surrounding a channel area. The transistors may include not only a field effect transistor (FET) such as a complementary FET (CFET), a negative FET (NCFET), a carbon nanotube FET (CNTFET), etc. but may also include a bipolar junction transistor and other three-dimensional transistors.

The first amplifier 100a may include a current source 120a. The current source 120a may supply a constant current regardless of changes in impedance of a first impedance circuit 110_1a and a second impedance circuit 110_2a. In some embodiments, the current source 120a may supply a current which varies based on a common mode feedback signal CMFB.

The first amplifier 100a may include a first sensing resistor R1 and a second sensing resistor R2. The first sensing resistor R1 may be connected between the first output node ON1 and a feedback node FN. The second sensing resistor R2 may be connected between the second output node ON2 and the feedback node FN. The common mode feedback signal CMFB may be output from the feedback node FN. A level of current provided by the current source 120a may vary according to a result of comparison between the common mode feedback signal CMFB and a reference signal reference CM.

The first amplifier 100a may include the first impedance circuit 110_1a and the second impedance circuit 110_2a. The impedance of the first impedance circuit 110_1a may be a first impedance Z1, and the impedance of the second impedance circuit 110_2a may be a second impedance Z2.

The first impedance circuit 110_1a may be connected between the first output node ON1 and a ground node. The first impedance circuit 110_1a may include a first load resistor RL1, a second load resistor RL2, and a plurality of transistors M1 to M3.

The plurality of transistors M1 to M3 may be connected to each other in parallel. Each of the plurality of transistors M1 to M3 may be switched based on first control codes PCODE[0] to PCODE[2]. The first transistor M1 may be switched by receiving the PCODE[0] through a gate terminal, and the second transistor M2 may be switched by receiving the PCODE[1] through a gate terminal, and the third transistor M3 may be switched by receiving the PCODE[2] through a gate terminal. With reference to FIG. 2, the first impedance circuit 110_1a is described as including three transistors, i.e., the first, second, and third transistors M1, M2, and M3; however, embodiments are not limited thereto. The greater the number of turned-on transistors among the plurality of transistors M1 to M3, the less the first impedance Z1 may become.

The plurality of transistors M1 to M3 and the first load resistor RL1 may be connected in parallel. Accordingly, even when the plurality of transistors M1 to M3 are turned off, as a current may flow from the first output node ON1 to the ground node, a voltage according to the first load resistor RL1 may be generated as the second output signal Y_outb.

The first load resistor RL1 and the second load resistor RL2 may be connected in series. The second load resistor RL2 may be connected to the first output node ON1. As the second load resistor RL2 is arranged between the first output node ON1 and the plurality of transistors M1 to M3, the noise, which may be generated in regard to the second output signal Y_outb when the plurality of transistors M1 to M3 are switched, may be reduced or prevented by the second load resistor RL2. However, embodiments are not limited thereto, and the second load resistor RL2 may be arranged between the ground node and the plurality of transistors M1 to M3.

The second impedance circuit 110_2a may be connected between the second output node ON2 and the ground node. The second impedance circuit 110_2a may include a third load resistor RL3, a fourth load resistor RL4, and a plurality of transistors M4 to M6. The plurality of transistors M4 to M6 may be connected to each other in parallel.

Each of the plurality of transistors M4 to M6 may be switched based on second control codes NCODE[0] to NCODE[2]. The fourth transistor M4 may be switched by receiving the NCODE[0] through a gate terminal, and the fifth transistor M5 may be switched by receiving the NCODE[1] through a gate terminal, and the sixth transistor M6 may be switched by receiving the NCODE[2] through a gate terminal. With reference to FIG. 2, the second impedance circuit 110_2a is described as including three transistors, i.e., the fourth, fifth, and sixth transistors M4, M5, and M6; however, embodiments are not limited thereto. The greater the number of turned-on transistors among the plurality of transistors M4 to M6, the less the second impedance Z2 may become.

The plurality of transistors M4 to M6 and the third load resistor RL3 may be connected in parallel. Accordingly, even when the plurality of transistors M4 to M6 are turned off, as a current may flow from the second output node ON2 to the ground node, a voltage according to the third load resistor RL3 may be generated as the first output signal Y_out.

The third load resistor RL3 and the fourth load resistor RL4 may be connected in series. The fourth load resistor RL4 may be connected to the second output node ON2. As the fourth load resistor RL4 is arranged between the first output node ON2 and the plurality of transistors M4 to M6, the noise, which may be generated in regard to the first output signal Y_out when the plurality of transistors are switched, may be reduced or prevented by the fourth load resistor RL4. However, embodiments are not limited thereto, and the fourth load resistor RL4 may be arranged between the ground node and the plurality of transistors M4 to M6.

The gate terminal of the first input transistor P1 may receive the first input signal Y_in, and a size (e.g., amperage) of current flowing in the first input transistor P1 may be determined based on the first input signal Y_in. Specifically, in some embodiments, as the first input transistor P1 may be a P-type transistor, the smaller a size (e.g., magnitude of current or voltage) of the first input signal Y_in is, the higher a current flowing in the first input transistor P1 may become. However, embodiments are not limited thereto, and when the first input transistor P1 is an N-type transistor, the greater the size of the first input signal Y_in is, the higher the current flowing in the first input transistor P1 may become. In this specification, for convenience of explanation, the first input transistor P1 may be described as a P-type transistor.

The gate terminal of the second input transistor P2 may receive the second input signal Y_inb, and a size of current flowing in the second input transistor P2 may be determined based on the second input signal Y_inb. In some embodiments, as the second input transistor P2 may be a P-type transistor, the smaller a size of the second input signal Y_inb is, the higher a current flowing in the second input transistor P2 may become. However, embodiments are not limited thereto, and when the second input transistor P2 is an N-type transistor, the greater the size of the second input signal Y_inb is, the higher the current flowing in the second input transistor P2 may become. In this specification, for convenience of explanation, the second input transistor P2 may be described as a P-type transistor.

The size of the second output signal Y_outb may be understood as the first impedance Z1 multiplied by the current flowing in the first input transistor P1 by or responsive to the first input signal Y_in. Accordingly, the size of the second output signal Y_outb may be determined based on the first impedance Z1 and the size of the first input signal Y_in. For example, when the first impedance Z1 decreases, the second output signal Y_outb may be reduced, and when the size of the first input signal Y_in increases, the second output signal Y_outb may be reduced.

The size of the first output signal Y_out may be understood as the second impedance Z2 multiplied by the current flowing in the second input transistor P2 by or responsive to the second input signal Y_inb. Accordingly, the size of the first output signal Y_out may be determined based on the second impedance Z2 and the size of the second input signal Y_inb. For example, when the second impedance Z2 decreases, the first output signal Y_out may be reduced, and when the size of the second input signal Y_inb increases, the first output signal Y_out may be reduced.

When the second output signal Y_outb is greater than the first output signal Y_out, logic levels indicated by the first and second output signals Y_out and Y_outb may be determined as a logic low level. Accordingly, in some embodiments in which the first impedance Z1 is less than the second impedance Z2, the size of the first input signal Y_in may need to be smaller than the size of the second input signal Y_inb so that the first and second output signals Y_out and Y_outb may have a logic low level. In some embodiments in which the first impedance Z1 is greater than the second impedance Z2, even when the size of the first input signal Y_in is greater than the size of the second input signal Y_inb, the first and second output signals Y_out and Y_outb may have a logic low level.

When the first output signal Y_out is greater than the second output signal Y_outb, logic levels indicated by the first and second output signals Y_out and Y_outb may be determined as a logic high level. Accordingly, in some embodiments in which the first impedance Z1 is greater than the second impedance Z2, the size of the second input signal Y_inb may need to be smaller than the size of the first input signal Y_in so that the first and second output signals Y_out and Y_outb may have a logic high level. In some embodiments in which the first impedance Z1 is less than the second impedance Z2, even when the size of the second input signal Y_inb is greater than the size of the first input signal Y_in, the first and second output signals Y_out and Y_outb may have a logic high level.

That is, the interface circuit 10a according to an example embodiment may determine a logic level indicated by the first and second output signals Y_out and Y_outb by adjusting the sizes of the input signals Y_in and Y_inb according to the first and second impedances Z1 and Z2.

The code generator 200a may include a first control code generator 210a and a second control code generator 220a. The first control code generator 210a may generate a first control code PCODE to control the first impedance circuit 110_1a. The second control code generator 220a may generate a second control code NCODE to control the second impedance circuit 110_2a. The code generator 200a may be a digital generator that generates signals represented by bits, or may be an analog generator that generates signals having a continuous size. That is, in this specification, the first control code PCODE and the second control code NCODE may be a digital signal represented by "1" or "0," or an analog signal having a continuous size or represented by a continuous wave.

Figure 3:
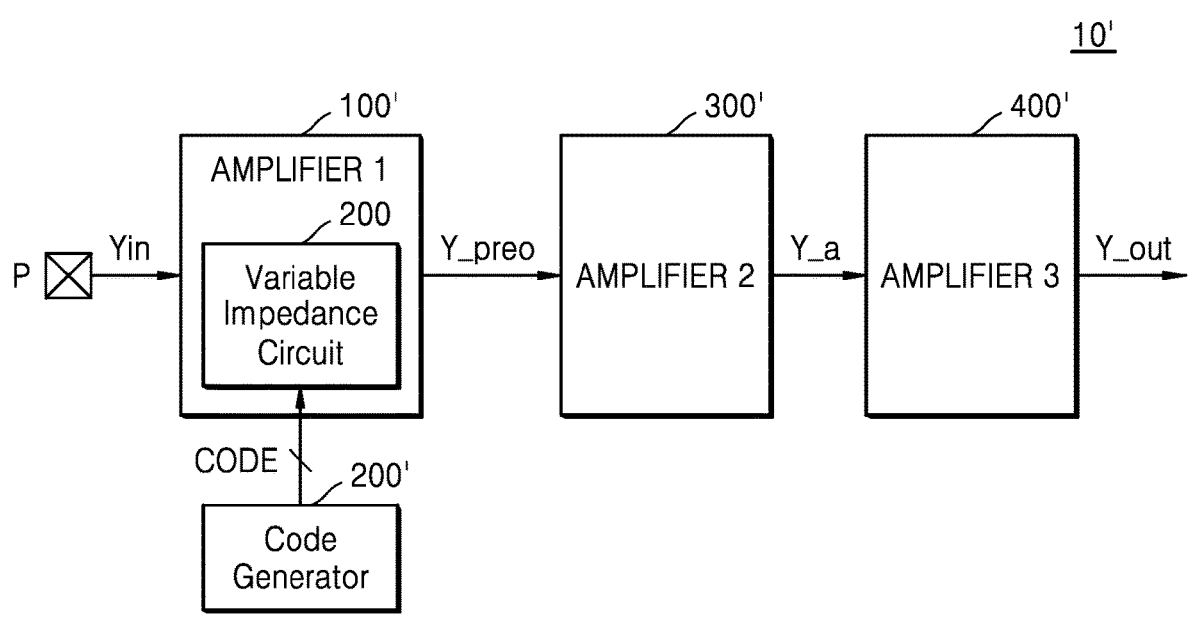
FIG. 3 is a block diagram illustrating an interface circuit according to an example embodiment.

FIG. 3 is a block diagram illustrating an interface circuit according to an example embodiment. With reference to FIG. 3, an interface circuit 10' may include a first to third amplifiers 100', 300', and 400'. The first to third of amplifiers 100', 300', and 400' may be connected in series. However, the number and/or electrical interconnections of amplifiers included in the interface circuit 10' is not limited thereto, and at least two of the amplifiers may be connected in parallel.

The first amplifier 100' may be an example of amplifiers 100 and 100a illustrated in FIGS. 1 and 2. Accordingly, the first amplifier 100' may include a variable impedance circuit 110', and the variable impedance circuit 110' may include, for example, the first impedance circuit 110_1a and the second impedance circuit 110_2a illustrated in FIG. 2. The first amplifier 100' may receive the first input signal Y_in and output a first output signal Y_preo. The first output signal Y_preo may correspond to the output signal Yout of FIG. 1. In some embodiments, the first output signal Y_preo may have a voltage level that is not recognized as a logic high level or a logic low level. Accordingly, the first output signal Y_preo may be amplified to a voltage range recognized as a logic high level or a logic low level through the second amplifier 300' and/or the third amplifier 400'.

The second amplifier 300' may receive the first output signal Y_preo and output a second output signal Y_a. The second amplifier 300' may be an inverting amplifier or a non-inverting amplifier. The second output signal Y_a may have a voltage range recognized as a logic high level or a logic low level. For example, the second output signal Y_a may have a high level input voltage (VIH), which is a voltage range recognized as a logic high level, or have a low level input voltage (VIL), which is a voltage range recognized as a logic low level.

The third amplifier 400' may receive the second output signal Y_a and output a third output signal Y_out. The third amplifier 400' may be an inverting amplifier or a non-inverting amplifier. The third output signal Y_out may be or correspond to a positive supply voltage VDD or a negative supply voltage VSS. When the third output signal Y_out is a positive supply voltage VDD, a logic level of the third output signal Y_out may be recognized as a logic high level, and when the third output signal Y_out is a negative supply voltage VSS, a logic level of the third output signal Y_out may be recognized as a logic low level.

Figure 4:
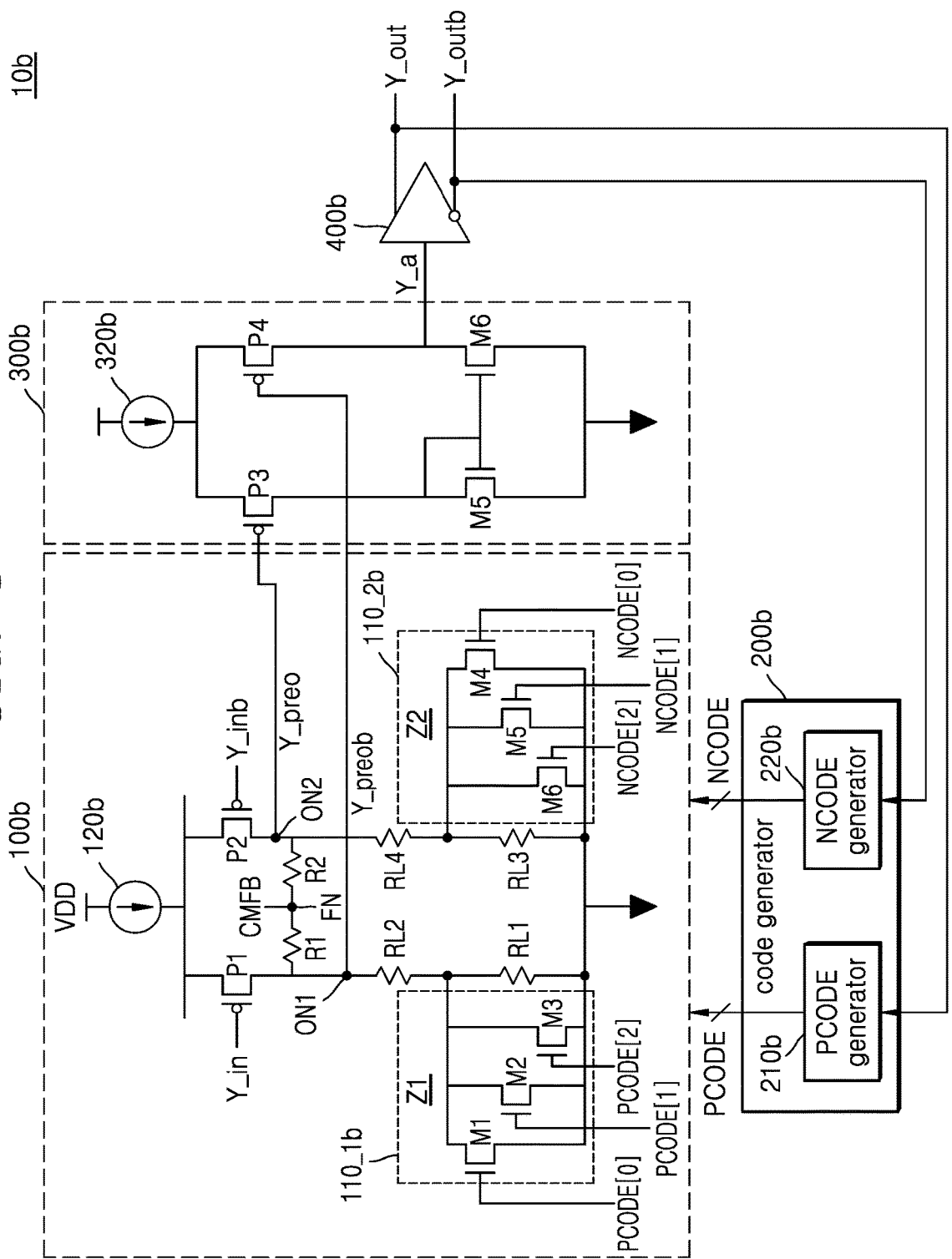
FIG. 4 is a circuit diagram illustrating an interface circuit according to an example embodiment.
Figure 5:
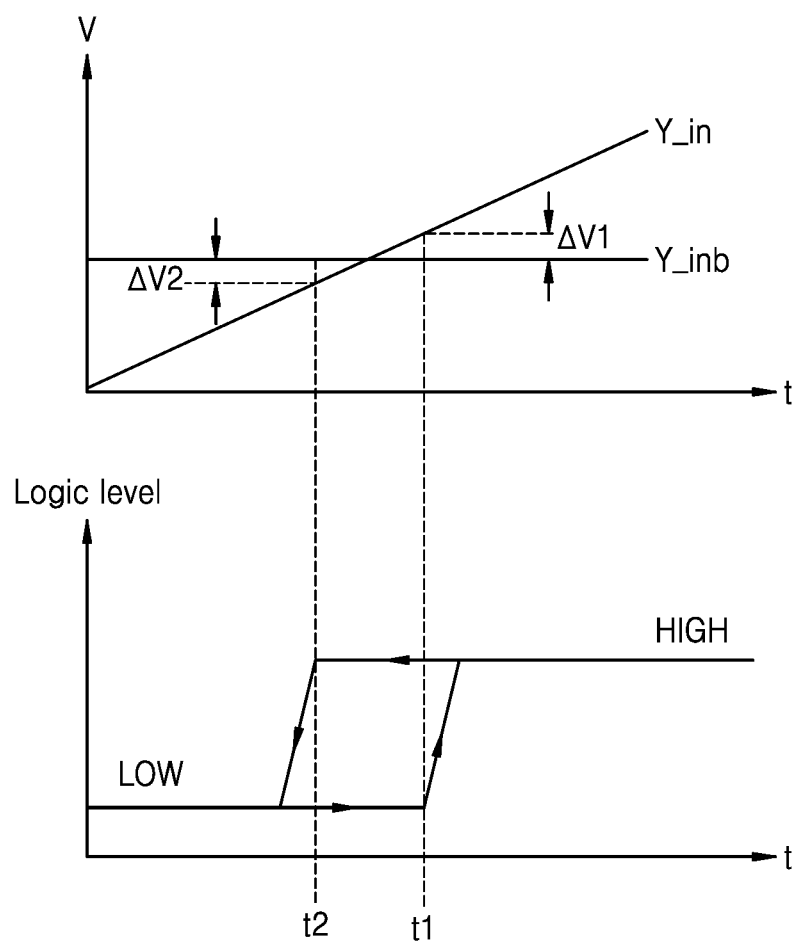
FIG. 5 is a graph illustrating the relationship between logic levels and input signals for noise removal according to an example embodiment.
Figure 6:
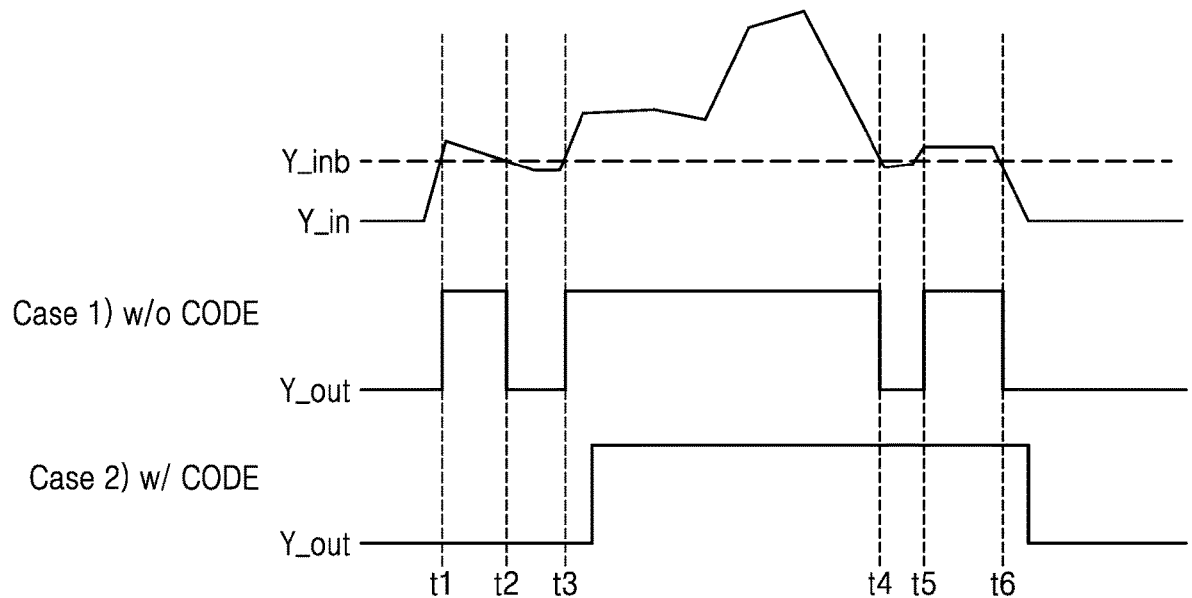
FIG. 6 is a graph illustrating noise removal effects according to an example embodiment.

FIG. 4 is a circuit diagram illustrating an interface circuit according to an example embodiment. FIG. 5 is a graph illustrating the relationship between logic levels and input signals for noise removal according to an example embodiment. FIG. 6 is a graph illustrating noise removal effects according to an example embodiment. With reference to FIG. 4, an interface circuit 10b may include a first amplifier 100b, a second amplifier 300b, a third amplifier 400b, and a code generator 200b. Descriptions provided above with reference to FIG. 2 may be omitted hereinafter. The interface circuit 10b may receive the first input signal Y_in and the second input signal Y_inb, and output a fourth output signal Y_out and a fifth output signal Y_outb. The fifth output signal Y_outb may have a voltage level opposite to that of the fourth output signal Y_out. That is, when the fourth output signal Y_out is or corresponds to a positive supply voltage VDD, the fifth output signal Y_outb may be or correspond to a negative supply voltage VSS, and when the fourth output signal Y_out is or corresponds to a negative supply voltage VSS, the fifth output signal Y_outb may be or correspond to a positive supply voltage VDD. The interface circuit 10b may perform the noise removal operation by controlling a first impedance circuit 110_1b based on the fourth output signal Y_out, and controlling a second impedance circuit 110_2b based on the fifth output signal Y_outb. More specific operations may be described later.

The second amplifier 300b may be an amplifier including a current source 320b and a plurality of transistors P3, P4, M5, and M6. The second amplifier 300b may be a single-stage differential amplifier. That is, the second amplifier 300b may receive a first output signal Y_preo and a second output signal Y_preob and output a third output signal Y_a. The second amplifier 300b may generate a third output signal Y_a by amplifying a difference between the first output signal Y_preo and the second output signal Y_preob. The third output signal Y_a may have a voltage range recognized as a logic high level or a logic low level. For example, the third output signal Y_a may have a VIH, which is a voltage range recognized as a logic high level, or have a VIL, which is a voltage range recognized as a logic low level. For example, when a size of the first output signal Y_preo is greater than a size of the second output signal Y_preob, the third output signal Y_a may have a voltage range recognized as a logic high level, and when the size of the second output signal Y_preob is greater than the size of the first output signal Y_preo, the third output signal Y_a may have a voltage range recognized as a logic low level.

The third amplifier 400b may receive the third output signal Y_a and output the fourth output signal Y_out and the fifth output signal Y_outb. The polarity of the fourth output signal Y_out may be identical to the polarity of the third output signal Y_a. The fourth output signal Y_out may have a voltage level opposite to that of the fifth output signal Y_outb. When the fourth output signal Y_out is or corresponds to a positive supply voltage VDD, and the fifth output signal Y_outb is or corresponds to a negative supply voltage VSS, it may be understood that the fourth and fifth output signals Y_out and Y_outb have a logic high level. When the fourth output signal Y_out is or corresponds to a negative supply voltage VSS, and the fifth output signal Y_outb is or corresponds to a positive supply voltage VDD, it may be understood that the output signals have a logic low level.

The code generator 200b may include a first code generator 210b and a second code generator 220b.

The code generator 200b may generate control codes PCODE and NCODE based on the fourth output signal Y_out and the fifth output signal Y_outb. During the noise removal operation, the first code generator 210b may control the first impedance circuit 110_1b by generating the first control code PCODE based on the fourth output signal Y_out. The second code generator 220b may control the second impedance circuit 110_2b by generating the second control code NCODE based on the fifth output signal Y_outb.

In some embodiments, when the fourth output signal Y_out is or corresponds to a positive supply voltage VDD and the fifth output signal Y_outb is or corresponds to a negative supply voltage VSS, i.e., when the fourth and fifth output signals Y_out and Y_outb have a logic high level, the code generator 200b may perform the noise removal operation by generating control codes PCODE and NCODE so that the first impedance Z1 becomes less than the second impedance Z2. For the logic level of the fourth output signal Y_out and the fifth output signal Y_outb to become a logic low level, the size of the second output signal Y_preob may need to be greater than the size of the first output signal Y_preo. Accordingly, when the first impedance Z1 is less than the second impedance Z2, the size of the first input signal Y_in may need to be smaller than the size of the second input signal Y_inb.

For example, as shown in FIG. 5, for the logic level of the fourth output signal Y_out and the fifth output signal Y_outb to change or transition to a logic low level from a logic high level, the first input signal Y_in may be required to have a voltage level lower than that of the second input signal Y_inb by a second reference level ΔV2. Hence, when the fourth output signal Y_out and the fifth output signal Y_outb have a logic high level, as the logic high level may be maintained even when the size or voltage level of the first input signal Y_in becomes slightly less due to noise, the noise removal effects may occur.

In some embodiments, the code generator 200b may control the number of turned-on transistors among the plurality of transistors M1 to M3 included in the first impedance circuit 110_1b to be greater than the number of turned-on transistors among the plurality of transistors M4 to M6 included in the second impedance circuit 110_2b.

In some embodiments, when the fifth signal Y_outb is or corresponds to a positive supply voltage VDD, and the fourth output signal Y_out is or corresponds to a negative supply voltage VSS, i.e., the fourth and fifth output signals Y_out and Y_outb have a logic low level, the code generator 200b may perform the noise removal operation by generating the control codes PCODE and NCODE so that the second impedance Z2 becomes less than the first impedance Z1. For the logic level of the fourth output signal Y_out and fifth output signal Y_outb to become a logic high level, the size of the first output signal Y_preo may need to be greater than the size of the second output signal Y_preob. Accordingly, when the second impedance Z2 is less than the first impedance Z1, the size of the first input signal Y_in may need to be smaller than the size of the second input signal Y_inb.

For example, as illustrated in FIG. 5, for the logic level of the fourth output signal Y_out and the fifth output signal Y_outb to change or transition to a logic high level from a logic low level, the first input signal Y_in may need to have a voltage level greater than the second input signal Y_inb by a first reference level ΔV1. Hence, when the fourth output signal Y_out and the fifth output signal Y_outb have a logic low level, as the logic low level may be maintained even when the size or voltage level of the first input signal Y_in becomes slightly greater due to noise, the noise removal effects may occur.

In some embodiments, the code generator 200b may control the number of turned-on transistors among the plurality of transistors M1 to M3 included in the first impedance circuit 110_1b to be greater than the number of turned-on transistors among the plurality of transistors M4 to M6 included in the second impedance circuit 110_2b.

With reference to FIG. 5, when the output signals Y_out and Y_outb have a logic low level, the logic level may become a logic high level at a first time t1 when the first input signal Y_in becomes greater than the second input signal Y_inb by the first reference level ΔV1.

Meanwhile, when the output signals Y_out and Y_outb have a logic high level, the logic level may become a logic low level at a time t2 when the first input signal Y_in becomes less than the second input signal Y_inb by the second reference level ΔV2.

With reference to FIG. 6, noise may be generated in regard to the first and second input signals Y_in and Y_inb. For example, the first and second input signals Y_in and Y_inb may have a logic high level from a third time t3 to a sixth time t6, and have a logic low level at the rest of the time periods; however, there may be time periods in which accurate logic levels may not be easily recognized due to noise.

In case 1 where the code generator 200b does not generate a control code, when the first input signal Y_in is greater than the second input signal Y_inb, the fourth output signal Y_out may have a logic high level, and when the first input signal Y_in is smaller than the second input signal Y_inb, the fourth output signal Y_out may have a logic low level. Accordingly, at the first time t1 to the second time t2 when the noise occurs, the fourth output signal Y_out may be misrecognized as having a logic high level, and at the fourth time t4 to the fifth time 5, it may be misrecognized as having a logic low level.

In case 2 where the code generator 200b generates control codes, noise between the first time t1 to the second t2 and the fourth time t4 to the fifth time t5 may be removed. Specifically, even if the first input signal Y_in becomes greater than the second input signal Y_inb momentarily due to the noise of the first and second input signals Y_in and Y_inb, when a difference between the first input signal Y_in and the second input signal Y_inb is less than the first reference level ΔV1, the fourth output signal Y_out may maintain the logic low level, as illustrated in FIG. 6. Also, even if the first input signal Y_in becomes smaller than the second input signal Y_inb momentarily between the fourth time t4 and the fifth time t5, when the difference between the first input signal Y_in and the second input signal Y_inb is less than the second reference level ΔV2, the fourth output signal Y_out may maintain the logic high level, as illustrated in FIG. 6.

As described above, the interface circuit according to the example embodiments may control the first impedance Z1 based on the fourth output signal Y_out, and control the second impedance Z2 based on the fifth output signal Y_outb to perform the noise removal operation in regard to the output signals Y_out and Y_outb.

Figure 7:
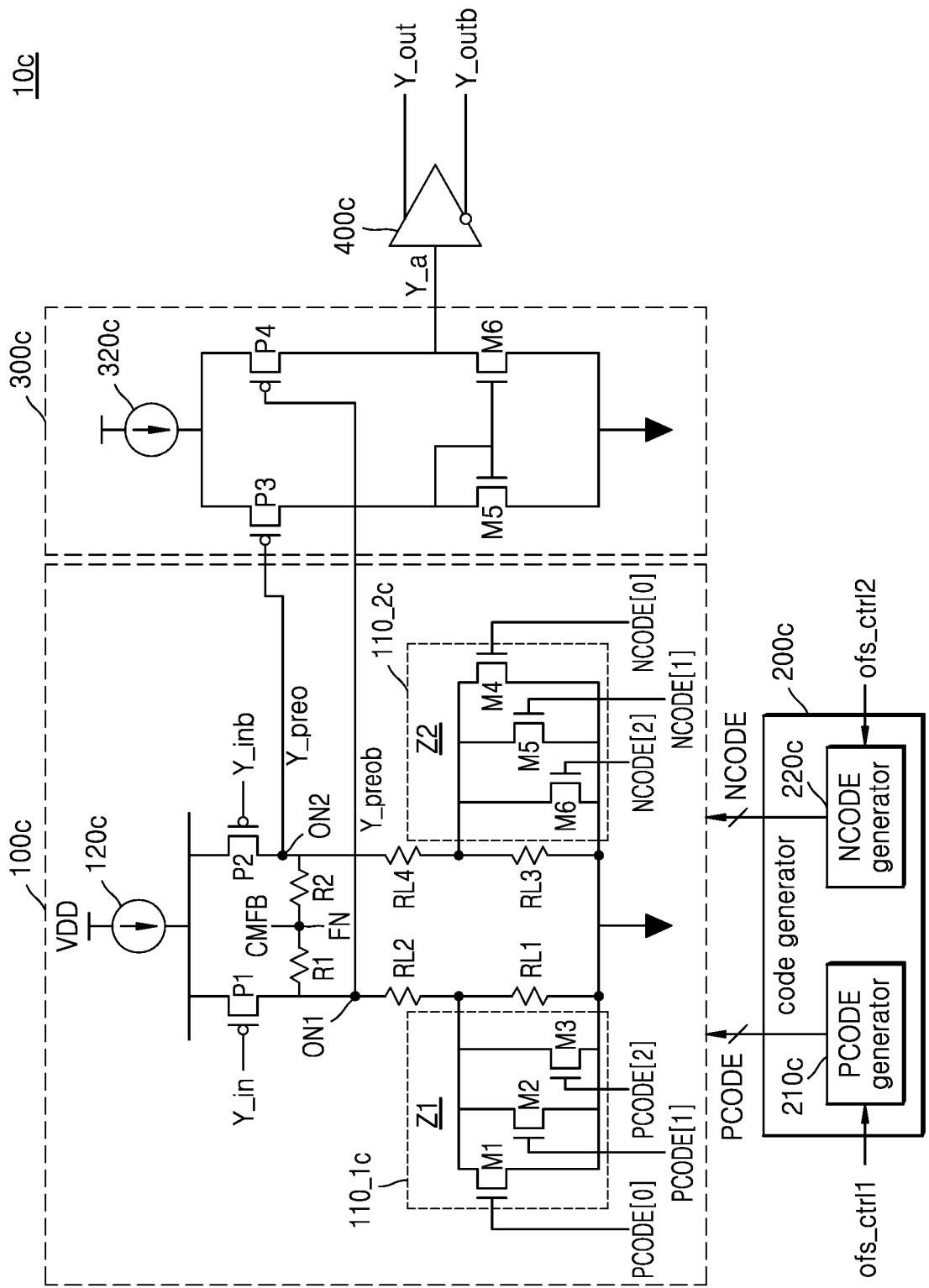
FIG. 7 is a circuit diagram illustrating an interface circuit according to an example embodiment.
Figure 8:
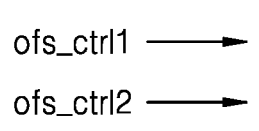
FIG. 8 is a diagram illustrating an error voltage correction operation according to an example embodiment.
Figure 9:
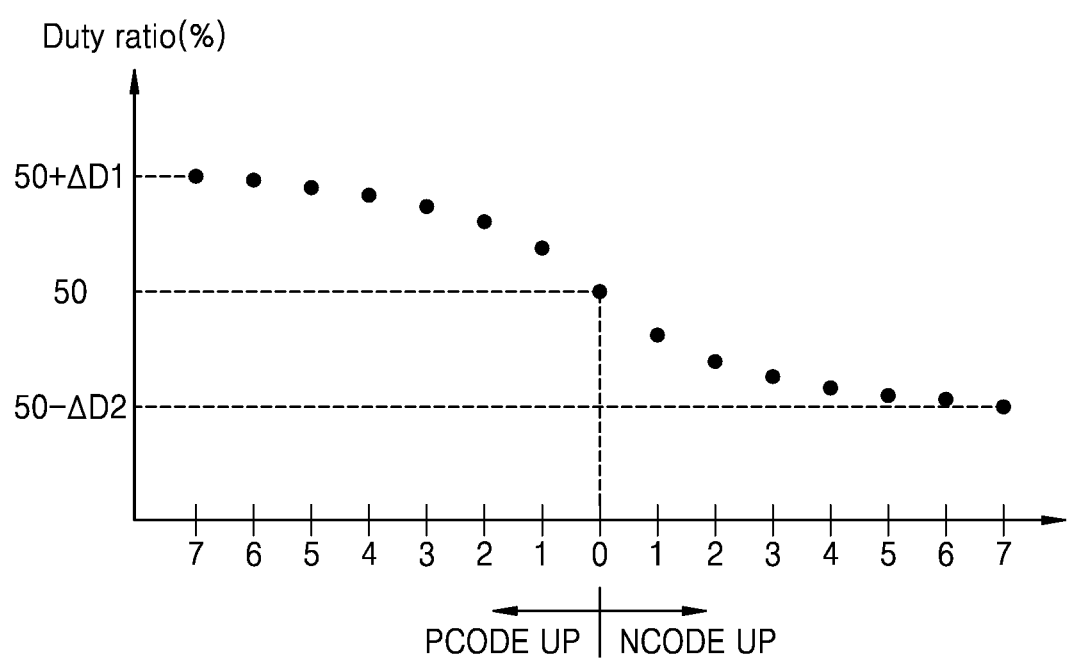
FIG. 9 is a graph illustrating an error voltage correction operation according to an example embodiment.
Figure 10:
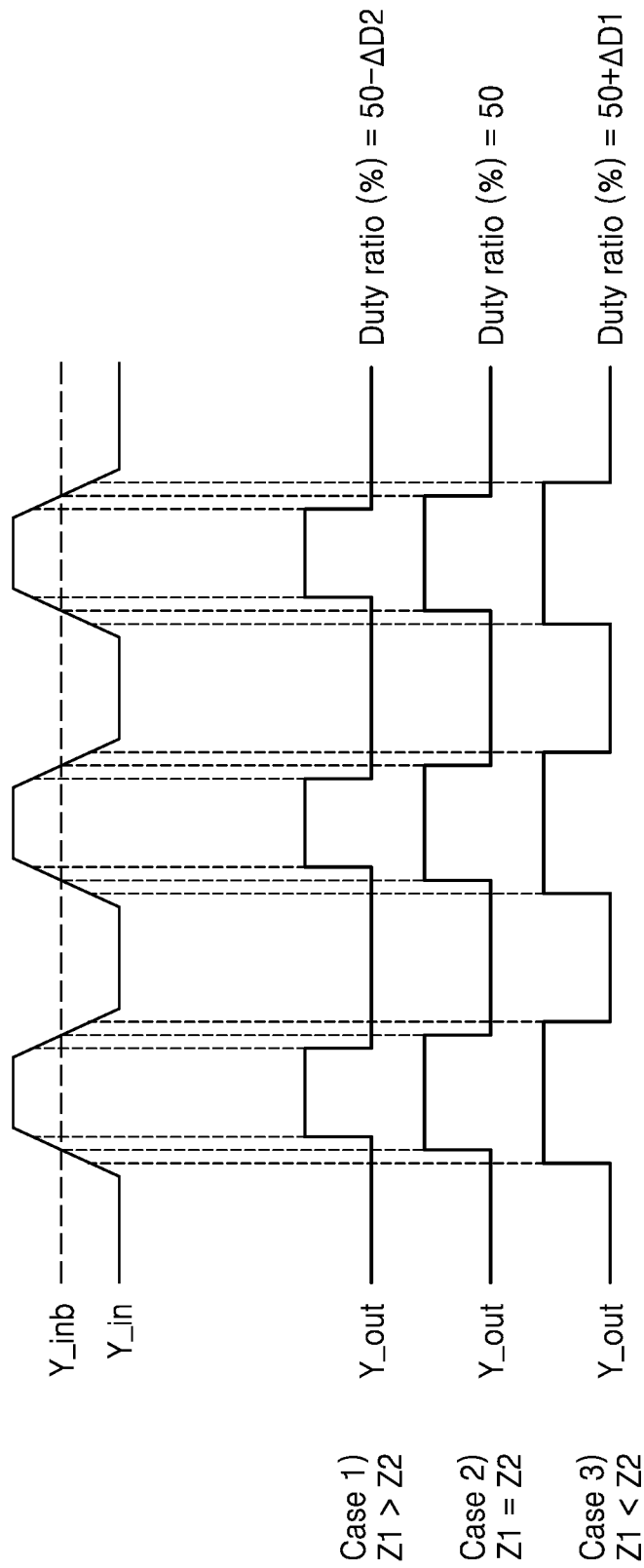
FIG. 10 is a timing chart illustrating an error voltage correction operation according to an example embodiment.

FIG. 7 is a circuit diagram of an interface circuit according to an example embodiment. FIG. 8 is a diagram illustrating an error voltage correction operation according to an example embodiment. FIG. 9 is a graph illustrating an error voltage correction operation according to an example embodiment. FIG. 10 is a timing diagram illustrating an error voltage correction operation according to an example embodiment. With reference to FIG. 7, an interface circuit 10c according to an example embodiment may include a first amplifier 100c, a second amplifier 300c, a third amplifier 400c, and a code generator 200c. Descriptions provided above with reference to FIGS. 2 and 4 may be omitted hereinafter.

The code generator 200c may generate control codes PCODE and NCODE based on first and second error voltage control signals ofs_ctrl1 and ofs_ctrl2. Specifically, a first code generator 210c may switch the plurality of transistors M1 to M3 to adjust a voltage level of the second output signal Y_preob according to the first error voltage control signal ofs_ctrl1. A second code generator 220c may switch the plurality of transistors M4 to M6 to adjust a voltage level of the first output signal Y_preo according to the second error voltage control signal ofs_ctrl2. That is, unlike the code generator 200b of FIG. 4, the code generator 200c may receive the first and second error voltage control signals ofs_ctrl1 and ofs_ctrl2, and output a predetermined calibration code as the first control code PCODE and the second control code NCODE to separately control the first output signal Y_preo and the second output signal Y_preob. When the size of the first impedance Z1 becomes smaller than the size of the second impedance Z2, the size of the second output signal Y_preob may become smaller as well. When the size of the second impedance Z2 becomes smaller than the size of the first impedance Z1, the size of the first output signal Y_preo may become smaller as well.

With reference to FIG. 8, the code generator 220c may generate a 3-bit first control code PCODE and a 3-bit second control code NCODE, respectively. Each bit may represent a signal applied to the gate terminal of the plurality of transistors M1 to M6.

With reference to FIG. 8, the code generator 220c may control the first impedance Z1 by the plurality of transistors M1 to M3 by generating the first control code PCODE based on the first error voltage control signal ofs_ctrl1 and thus, control the size of the second output signal Y_preob. For example, when the first control code PCODE is "000," the first to third transistors M1 to M3 may become turned off, and thus, the size of the first impedance Z1 may be the greatest. The code generator 220c may adjust the second impedance Z2 by the plurality of transistors M4 to M6 by generating the second control code NCODE based on the second error voltage control signal ofs_ctrl2 and thus, control the size of the first output signal Y_preo. For example, when the second control code NCODE is "000," the fourth to sixth transistors M4 to M6 may become turned off, and thus, the size of the second impedance Z2 may be the greatest.

As described above with reference to FIGS. 7 and 8, during the error correction operation which separately adjusts the sizes of the first and second output signals Y_out and Y_outb, duty ratio correction effects may occur, as described later with reference to FIGS. 9 and 10.

With reference to FIG. 9, a duty ratio of the output signals Y_out and Y_outb may be adjusted according to the control codes PCODE and NCODE. The more transistors the first control code PCODE turns on, the smaller the size of the first impedance Z1 becomes, which leads to an increased duty ratio. For example, when the 3-bit first control code PCODE turns on all of the first, second, and third transistors M1, M2, and M3, the duty ratio of the output signals Y_out and Y_outb may be 50+ΔD1%. That is, as described with reference to FIG. 5, in the case where the size of the first impedance Z1 becomes less, the logic level of the fourth output signal Y_out may change when the size of the first input signal Y_in is smaller than the size of the second input signal Y_inb, which leads to an increased duty ratio. The more transistors the second control code NCODE turns on, the smaller the size of the second impedance Z2 becomes, which leads to a reduced duty ratio. For example, when the 3-bit second control code NCODE turns on all of the fourth, fifth, and sixth transistors M4, M5, and M6, the duty ratio of the output signals Y_out and Y_outb may be 50−ΔD2%. That is, as described with reference to FIG. 5, in the case where the size of the second impedance Z2 becomes less, the logic level of the fourth output signal Y_out may change when the size of the first input signal Y_in is greater than the size of the second input signal Y_inb, which leads to a reduced duty ratio.

With reference to FIG. 10, even when the input signals Y_in and Y_inb have the same waveform, the duty ratio of the fourth output signal Y_out may change according to the first impedance Z1 and the second impedance Z2. Specifically, in case 1 where the first impedance Z1 is greater than the second impedance Z2, the duty ratio may be 50−ΔD2%. In case 2 where the first impedance Z1 is identical to the second impedance Z2, the duty ratio may be 50%. In case 3 where the second impedance Z2 is greater than the first impedance Z1, the duty ratio may be 50+ΔD1%.

The interface circuit 10c according to an example embodiment may control a duty ratio of an output signal by varying impedance through a predetermined control code. Further, as the interface circuit 10c may have the same structure as the interface circuit 10b of FIG. 4, it may perform both of the noise removal operation and the error voltage correction operation using a single structure. Accordingly, as it is not required to provide separate circuits for each of the noise removal operation and the error voltage correction operation, the degree of integration of the circuit may be improved.

Figure 11:
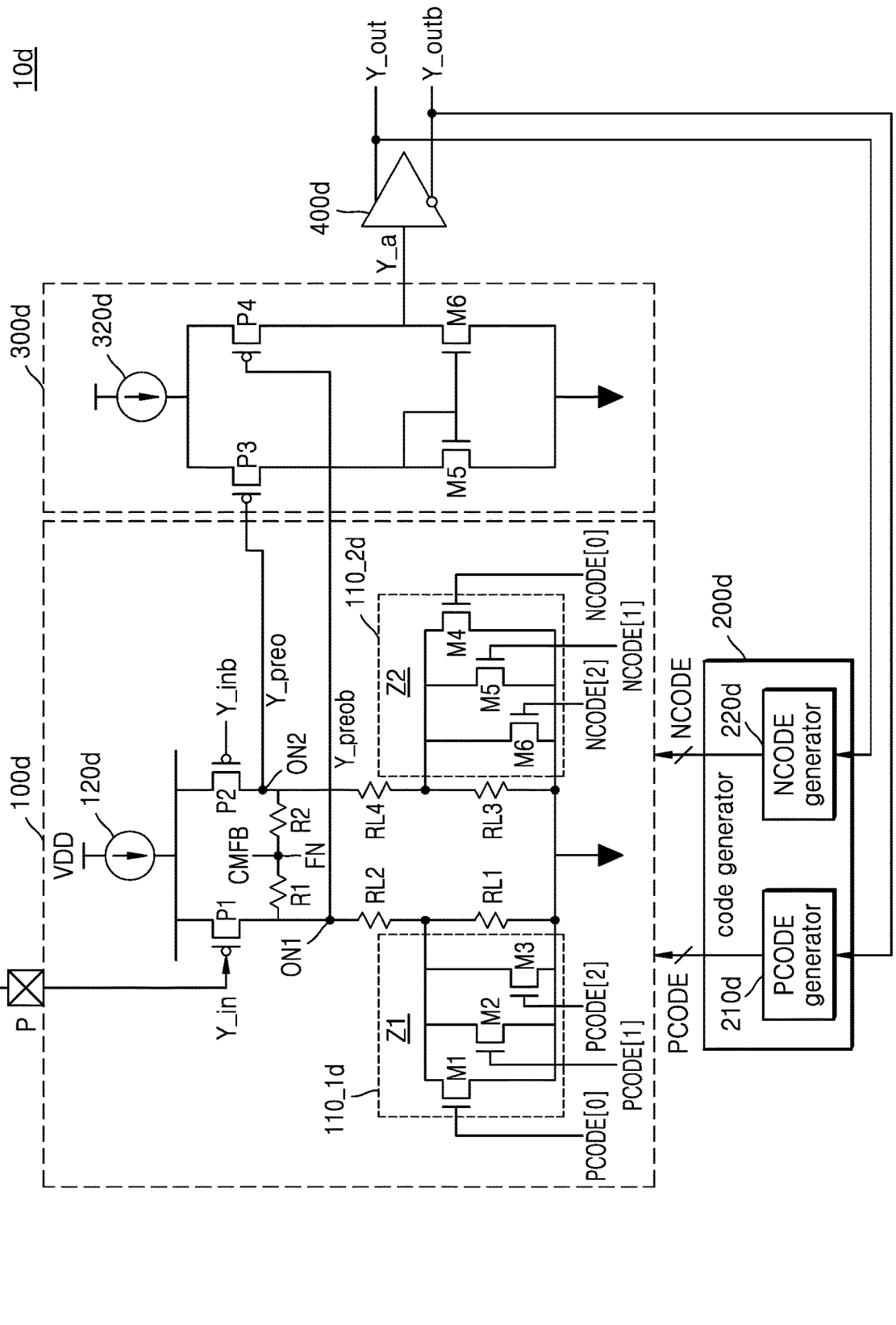
FIG. 11 is a circuit diagram illustrating an interface circuit according to an example embodiment.
Figure 12:
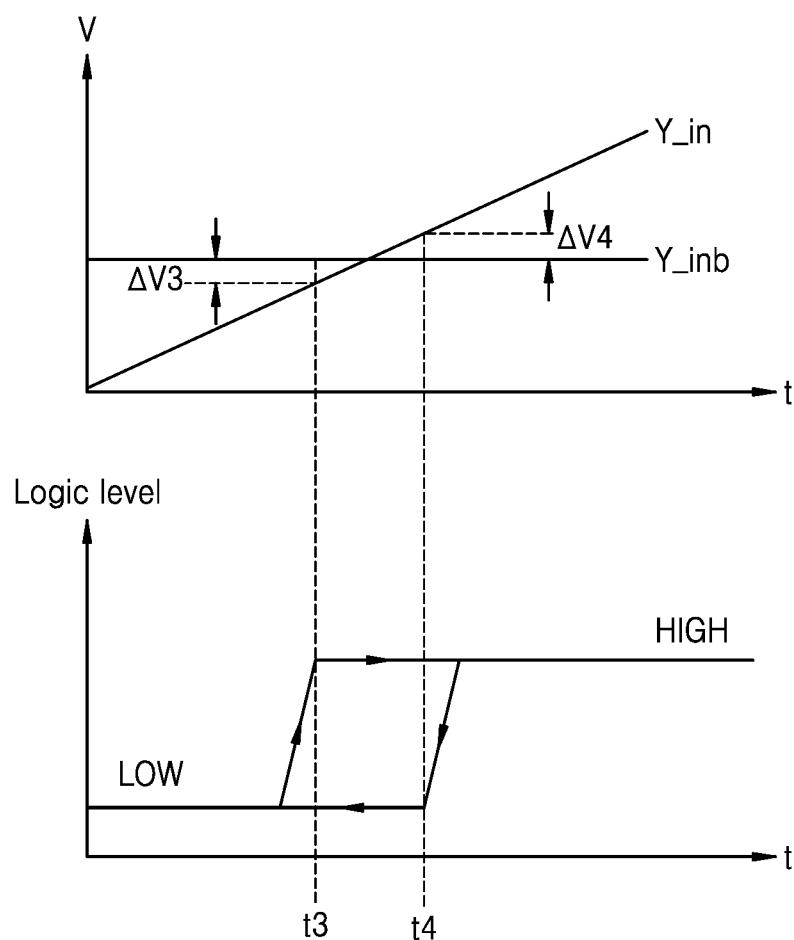
FIG. 12 is a graph illustrating the relationship between logic levels and input signals for an equalization operation according to an example embodiment.
Figure 13:
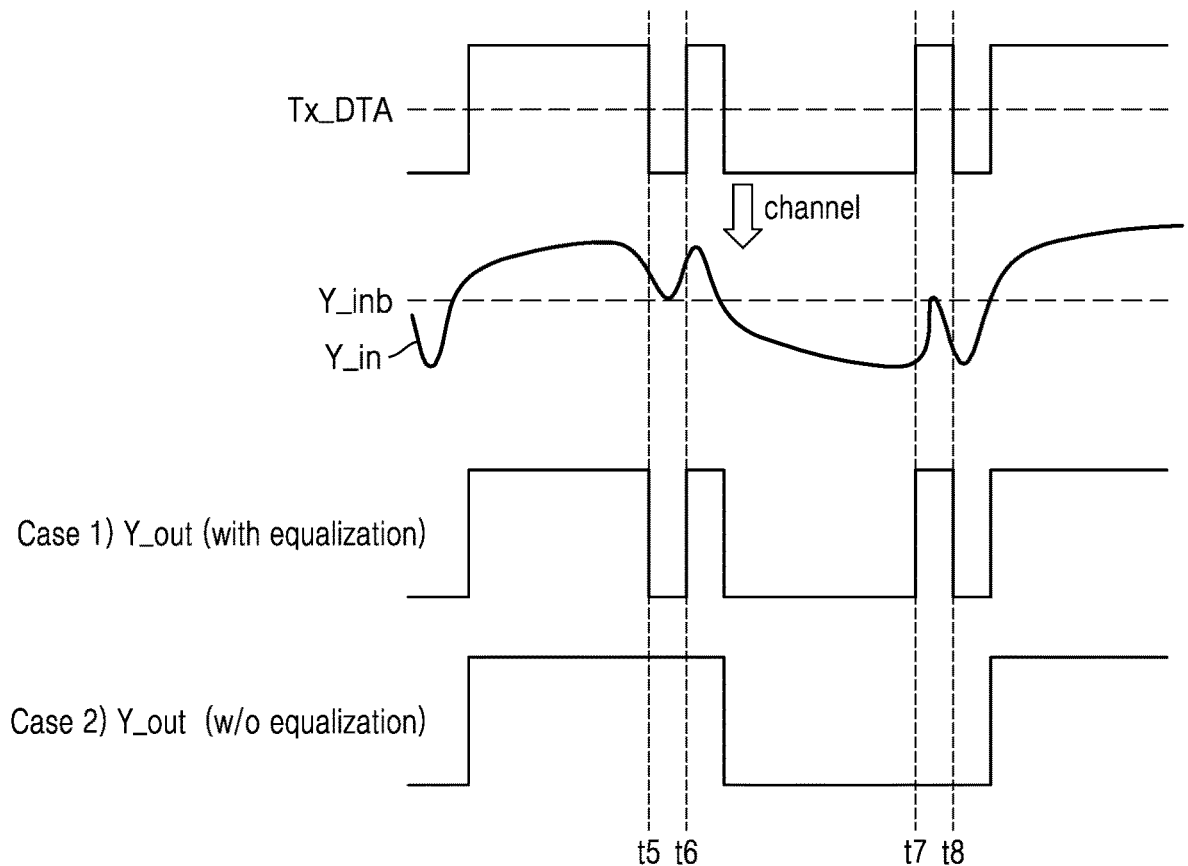
FIG. 13 is a timing chart illustrating an equalization operation according to an example embodiment.

FIG. 11 is a circuit diagram of an interface circuit according to an example embodiment. FIG. 12 is a graph illustrating the relationship between logic levels and input signals for an equalization operation according to an example embodiment. FIG. 13 is a timing diagram illustrating an equalization operation according to an example embodiment.

With reference to FIG. 11, an interface circuit 10d may include a first amplifier 100d, a second amplifier 300d, a third amplifier 400d, and a code generator 200d. Descriptions provided above with reference to FIGS. 2, 4, and 8 may be omitted hereinafter.

The first amplifier 100d may receive the first input signal Y_in from the pin P. In some embodiments, the first amplifier 100d may receive the first input signal Y_in from a separate pin P', and receive the second input signal Y_inb from a reference signal generator. The pin P may be connected to a channel, and transmission data Tx_DTA transmitted by an external device may be provided through the channel. That is, as the transmission data Tx_DTA passes through the channel, inter-symbol interference (ISI) may occur, and a signal including the ISI may be received as the first input signal Y_in.

The interface circuit 10*d* according to an example embodiment may perform the equalization operation to remove the ISI. Specifically, the code generator 200*d* may include a first code generator 210*d* and a second code generator 220*d*. The first code generator 210*d* may control a first impedance circuit 110*d*_1*d* based on the fifth output signal Y_outb, and the second generator 220*d* may control a second impedance circuit 110*d*_2*d* based on the fourth output signal Y_out. For example, when the fourth and fifth output signals Y_out and Y_outb have a logic high level, i.e., when the fourth output signal Y_out is a positive supply voltage VDD, the second code generator 220*d* may generate the second control code NCODE to lower the second impedance Z2. Alternatively, the first code generator 210*d* may generate the first control code PCODE to increase the first impedance Z1. With reference to FIG. 12, the first and second generators 210*d* and 220*d* may generate the control codes PCODE and NCODE to control the logic level of the output signals to change to a logic low level from the fourth time t4 where the first input signal Y_in is greater than the second input signal Y_inb by a fourth reference level ΔV4 or less. In other words, the transition to logic low level may occur when the first input signal Y_in is within the fourth reference level ΔV4 of the second input signal Y_inb. That is, even when the first input signal Y_in is greater than the second input signal Y_inb, the logic level of output signals may change to a logic low level.

In addition, when the fourth and fifth output signals Y_out and Y_outb have a logic low level, i.e., when the fifth output signal Y_outb is a positive supply voltage VDD, the first code generator 210*d* may generate the first control code PCODE to lower the first impedance Z1. Alternatively, the second code generator 220*d* may generate the second control code NCODE to increase the second impedance Z2. With reference to FIG. 12, the first and second generators 210*d* and 220*d* may generate the control codes PCODE and NCODE to control the logic level of the output signals to change to a logic high level from the third time t3 where the first input signal Y_in is smaller than the second input signal Y_inb by a third reference level ΔV3 or less. In other words, the transition to logic high level may occur when the first input signal Y_in is within the third reference level ΔV3 of the second input signal Y_inb. That is, even when the first input signal Y_in is less than the second input signal Y_inb, the logic level of the output signal may change to a logic high level.

With reference to FIG. 13, the transmission data Tx_DTA may be pulse data without noise. As the transmission data Tx_DTA passes through the channel, inter-symbol interference may occur, and the first input signal Y_in may have a different waveform than the transmission data Tx_DTA. Specifically, due to the inter-symbol interference between the fifth time t5 and the sixth time t6, the first input signal Y_in may be maintained to be greater than the second input signal Y_inb.

With reference to FIG. 13, in case 1 where the equalization operation is performed, the waveform of the fourth output signal Y_out may be identical to the waveform of the transmission data Tx_DTA. That is, the interface circuit 10*d* according to an example embodiment may change the logic level of the output signal Y_out to a logic low level by adjusting the impedance even when the first input signal Y_in is greater than the second input signal Y_inb (e.g., between time t5 and time t6), and change the logic level of the output signal Y_out to a logic high level even when the first input signal Y_in is less than the second input signal Y_inb (e.g., between time t7 and time t8). That is, according to an example embodiment, the equalization operation to remove the inter-symbol interference occurred in regard to the first input signal Y_in may be performed.

With reference to FIG. 13, in case 2 where the equalization operation is not performed, the waveform of the fourth output signal Y_out may be different than the waveform of the transmission data Tx_DTA. Specifically, due to the inter-symbol interference between the fifth time t5 and the sixth time t6, the first input signal Y_in may be maintained to be greater than the second input signal Y_inb. Accordingly, the fourth input signal Y_out may be recognized as having a logic high level. Further, due to the inter-symbol interference between the seventh time t7 and the eighth time t8, the first input signal Y_in may be maintained to be less than the second input signal Y_inb. Accordingly, the fourth input signal Y_out may be recognized as having a logic low level.

The interface circuit 10*d* according to an example embodiment may change the logic level of the output signal Y_out to a logic low level by adjusting the impedance even when the first input signal Y_in is greater than the second input signal Y_inb, and change the logic level of the output signal Y_out to a logic high level even when the first input signal Y_in is less than the second input signal Y_inb. That is, according to an example embodiment, the equalization operation to remove the inter-symbol interference occurred in regard to the first input signal Y_in may be performed. Further, as the interface circuit 10*d* may have the same structure as the interface circuits 10*b* and 10*c* of FIGS. 4 and 7, it may perform all of the noise removal operation, the error voltage correction operation, and the equalization operation using a single structure. Accordingly, as it is not required to provide separate circuits for each of the noise removal operation, the error voltage correction operation, and the equalization operation, the degree of integration of the circuit may be improved.

Figure 14:
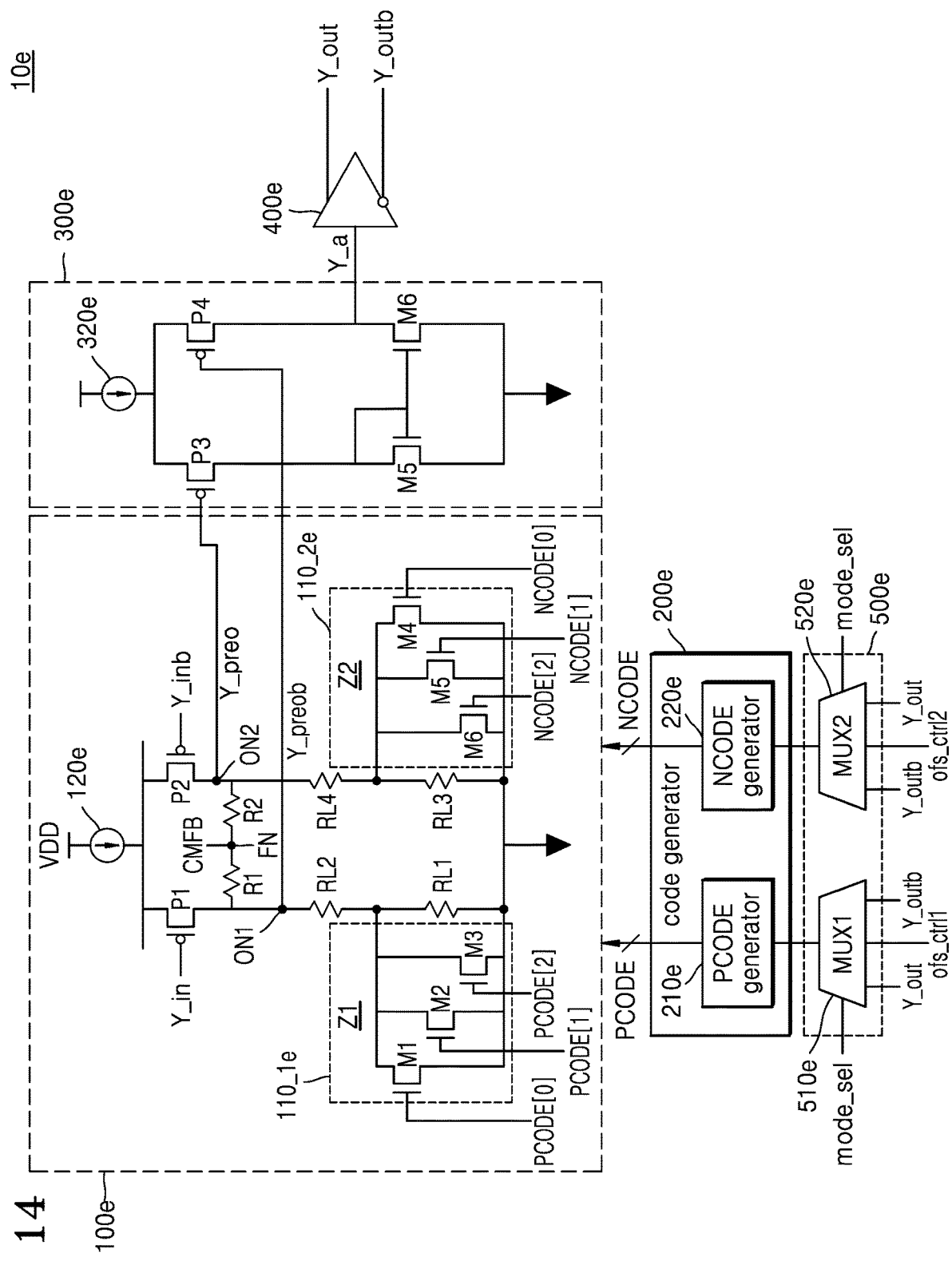
FIG. 14 is a circuit diagram illustrating an interface circuit according to an example embodiment.

FIG. 14 is a circuit diagram of an interface circuit according to an example embodiment.

With reference to FIG. 14, an interface circuit 10*e* may include a first amplifier 100*e*, a second amplifier 300*e*, a third amplifier 400*e*, a code generator 200*e*, and a selection circuit 500*e*. The selection circuit 500*e* may include a first selection circuit 510*e* and a second selection circuit 520*e*. Descriptions provided above with reference to FIGS. 4, 7, and 11 may be omitted hereinafter.

The code generator 200*e* may include a first code generator 210*e* and a second code generator 220*e*. The first selection circuit 510*e* may select one of a plurality of signals Y_out, Y_outb, and Duty_ctrl (shown as ofs_ctrl1) based on a mode selection signal mode_sel and provide the selected signal to the first code generator 210*e*. The second selection circuit 520*e* may select one of a plurality of signals Y_out, Y_outb, and Duty_ctrl (shown as ofs_ctrl2) based on the mode selection signal mode_sel and provide the selected signal to the second code generator 220*e*.

The mode selection signal mode_sel may be a signal representing at least one mode of the noise removal mode, the error voltage correction mode, and the equalization mode.

The first selection circuit 510*e* may provide the fourth output signal Y_out to the first code generator 210*e* when the mode selection signal mode_sel represents the noise removal mode. The first code generator 210e may control the first impedance circuit 110_1e based on the fourth output signal Y_out, as described above with reference to FIGS. 4 to 6. The second selection circuit 520e may provide the fifth output signal Y_outb to the second code generator 220e when the mode selection signal mode_sel represents the noise removal mode. The second code generator 220e may control the second impedance circuit 110_2e based on the fifth output signal Y_outb, as described above with reference to FIGS. 4 to 6.

The first selection circuit 510e may provide the predetermined calibration code as the first control code PCODE to the first code generator 210e when the mode selection signal mode_sel represents the error voltage correction mode. The second selection circuit 520e may provide the predetermined calibration code as the second control code NCODE to the second code generator 220e when the mode selection signal mode_sel represents the error voltage correction mode. Specific descriptions thereon are provided above with reference to FIGS. 7 to 10.

The first selection circuit 510e may provide the fifth output signal Y_outb to the first code generator 210e when the mode selection signal mode_sel represents the equalization mode. The first code generator 210e may control the first impedance circuit 110_1e based on the fifth output signal Y_outb, as described above with reference to FIGS. 11 and 13. The second selection circuit 520e may provide the fourth output signal Y_out to the second code generator 220e when the mode selection signal mode_sel represents the equalization mode. The second code generator 220e may control the second impedance circuit 110_2e based on the fourth output signal Y_out, as described above with reference to FIGS. 11 and 13.

By including the selection circuit, the interface circuit 10e according to an example embodiment may selectively perform the noise removal operation, the error voltage correction operation, and the equalization operation. Accordingly, as it is not required to provide separate circuits for each of the operations, the degree of integration of the circuit may be improved, and the size of the circuit may be reduced.

Figure 15:
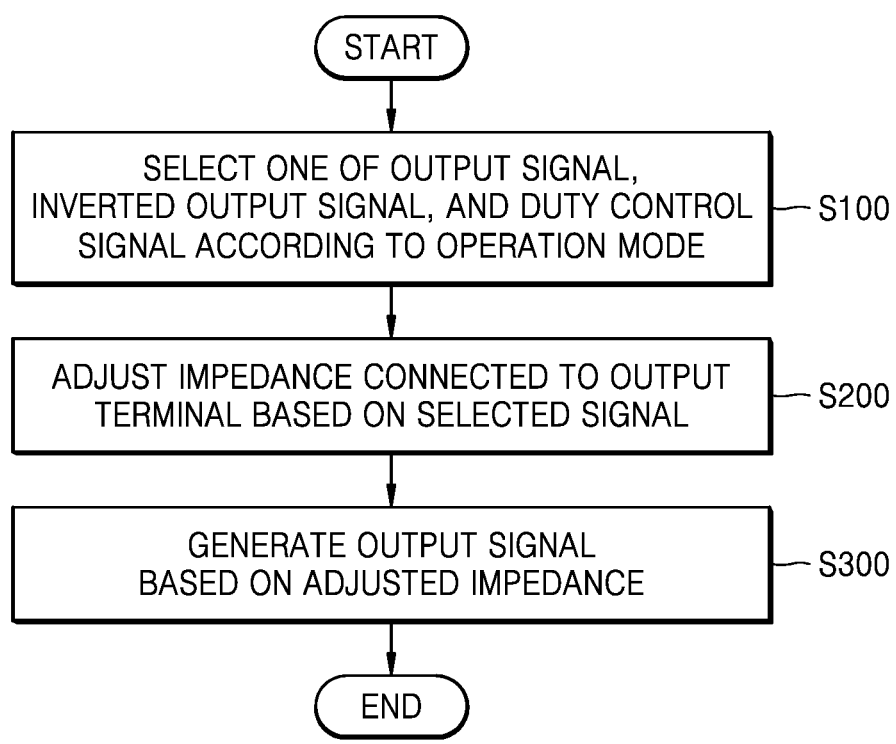
FIG. 15 is a flowchart illustrating an operating method of an interface circuit according to an example embodiment.

FIG. 15 is a flowchart illustrating operations of an interface circuit according to an example embodiment.

With reference to FIG. 15, operations of an interface circuit including a plurality of amplifiers may include multiple operations S100, S200, and S300. The interface circuit may receive a first input signal and a second input signal, and output a first output signal and a second output signal. A first amplifier of the plurality of amplifiers may receive the first input signal and the second input signal. The first amplifier may be, for example, the first amplifier 100e of FIG. 14. The first input signal may a signal received from an outside or external device through the pin P, and the second input signal may be a signal received from the reference voltage generator. A second amplifier of the plurality of amplifiers may receive a first output signal and a second output signal. The second amplifier may be, for example, the second amplifier 300e or the third amplifier 400e of FIG. 14. The interface circuit may be identical to the interface circuits described above with reference to at least one of FIGS. 1 to 14.

In operation S100, the interface circuit may select one of the first output signal, the second output signal, and the error voltage control signal as a signal to control output impedance.

Operation modes may include the noise removal mode, the error voltage correction mode, and the equalization mode. The first amplifier may include two output terminals. The two output terminals may be connected to the impedance circuit which varies according to the control codes. For example, the first output terminal may be connected to the first impedance circuit, and the second output terminal may be connected to the second impedance circuit.

In some embodiments, the interface circuit may select the first output signal as a signal to control the first impedance circuit when the operation mode is the noise removal mode, and the second output signal as a signal to control the second impedance circuit. When the operation mode is the error voltage correction mode, the error voltage control signal may be selected as a signal to control the first impedance circuit and the second impedance circuit. When the operation mode is the equalization mode, the second output signal may be selected as a signal to control the first impedance circuit, and the first output signal as a signal to control the second impedance circuit.

In operation S200, the interface circuit may adjust the impedance connected to the output terminal of the first amplifier based on the selected signal. Each of the first impedance and the second impedance may include a plurality of transistors. In operation S200, the interface circuit may adjust the impedance by switching the plurality of transistors based on the selected signal. Specific operations are described above with reference to FIGS. 1 to 14.

In operation S300, the interface circuit may generate an output signal based on the adjusted impedance. The interface circuit may selectively perform a plurality of operations in regard to the output signal by adjusting the impedance based on different signals according to the operation modes.

Figure 16:
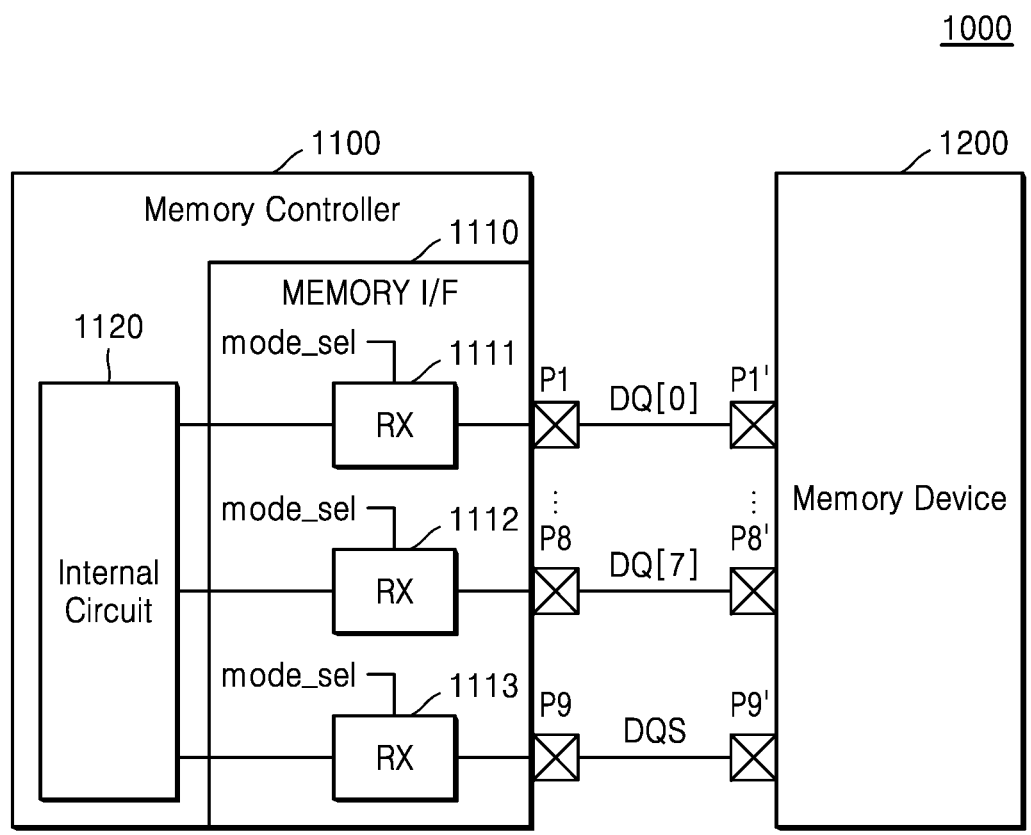
FIG. 16 is a block diagram illustrating a memory system employing an interface circuit according to an example embodiment.

FIG. 16 is a block diagram illustrating a memory system employing an interface circuit according to an example embodiment.

With reference to FIG. 16, a memory system 1000 may include a memory controller 1100 and a memory device 1200. A plurality of pins P1 to P9 connected to the memory controller 1100 may be connected to a plurality of pins P1' to P9' connected to the memory device 1200, respectively. The first to eight pins P1 to P8 and P1' to P8' may be referred to as DQ pins, and the nineth pins P9 and P9' may be referred to as DQS pins. The number of pins is not limited thereto. The DQ pin may be a pin configured to transmit and receive data, addresses, etc., and the DQS pin may be a pin configured to transmit and receive strobe signals to be synchronized with data transmitted to the DQ pin.

The memory controller 1100 may include a memory interface 1110 and an internal circuit 1120. The memory interface 1110 may include a first to ninth receiver circuits 1111 to 1113 connected to the plurality of pins P1 to P9. Each of the first to ninth receiver circuits 1111 to 1113 may be implemented as one example of the interface circuit described above with reference to FIGS. 1 to 14. For example, the first receiver circuit 1111 may receive signals from the first pin P1 and output signals to the internal circuit 1120. The memory interface 1110 may further include a plurality of transmitter circuits (although they are not shown in the drawings), and the transmitter circuits may be connected to at least one pin. Further, the memory device 1200 may be provided with a memory interface including a receiver circuit and a transmitter circuit, and the receiver circuit included in the memory device 1200 may be implemented by the interface circuit describe above with reference to FIGS. 1 to 14.

The internal circuit 1120 may perform operations to generally control the memory device 1200. For example, the internal circuit 1120 may generate and provide commands, addresses, and data to the memory device 1200. The memory controller 1100 may be connected to a host (although it is not shown in the drawings), and receive a request for access to the memory device 1200 from the host.

While the inventive concept has been particularly shown and described with reference to embodiments thereof, it will be understood that various changes in form and details may be made therein without departing from the scope of the following claims.

What is claimed is:

1. An interface circuit comprising:
   a first amplifier circuit comprising a first input terminal configured to receive a first input signal, a second input terminal configured to receive a second input signal, a first output node configured to output a first output signal, a second output node configured to output a second output signal, and a variable impedance circuit comprising a first impedance circuit connected to the first output node, and a second impedance circuit connected to the second output node; and
   a code generator circuit configured to generate a first control code and a second control code, wherein the first impedance circuit is configured to adjust an impedance thereof based on the first control code, and the second impedance circuit is configured to adjust an impedance thereof based on the second control code,
   wherein the first input signal is a voltage signal provided from an external device through a receiver pin, and the second input signal is a reference voltage signal having a predetermined voltage level.

2. The interface circuit of claim 1, wherein the first impedance circuit comprises a plurality of first transistors which are connected to each other in parallel and configured to be switched according to the first control code, and
   the second impedance circuit comprises a plurality of second transistors which are connected to each other in parallel and configured to be switched according to the second control code.

3. The interface circuit of claim 2, further comprising:
   a second amplifier circuit configured to receive the first output signal and the second output signal, generate a third output signal by amplifying a difference between the first output signal and the second output signal, and output the third output signal.

4. The interface circuit of claim 3, further comprising:
   a third amplifier circuit configured to receive the third output signal, generate a fourth output signal having a first logic level based on the third output signal, generate a fifth output signal having a second logic level, which is opposite to the first logic level, and output the fourth output signal and the fifth output signal.

5. The interface circuit of claim 4, wherein the code generator circuit comprises:
   a first code generator circuit configured to generate the first control code that controls switching of the first transistors to adjust the impedance of the first impedance circuit; and
   a second code generator circuit configured to generate the second control code that controls switching of the second transistors to adjust the impedance of the second impedance circuit.

6. The interface circuit of claim 5, wherein, in a noise removal mode,
   the first code generator circuit is configured to generate the first control code based on the fourth output signal, and
   the second code generator circuit is configured to generate the second control code based on the fifth output signal.

7. The interface circuit of claim 5, wherein, in an error voltage correction mode,
   the first code generator circuit is configured to generate the first control code based on a predetermined calibration code, and
   the second code generator circuit is configured to generate the second control code based on the predetermined calibration code.

8. The interface circuit of claim 5, wherein, in an equalization mode,
   the first code generator circuit is configured to generate the first control code based on the fifth output signal, and
   the second code generator circuit is configured to generate the second control code based on the fourth output signal.

9. The interface circuit of claim 5, further comprising:
   a first selection circuit configured to select a first one of the fourth output signal, the fifth output signal, or a duty control signal based on a mode selection signal, and provide the first one of the fourth output signal, the fifth output signal, or the duty control signal that was selected to the first code generator circuit; and
   a second selection circuit configured to select a second one of the fourth output signal, the fifth output signal, or the duty control signal based on the mode selection signal, and provide the second one of the fourth output signal, the fifth output signal, or the duty control signal that was selected to the second code generator circuit.

10. The interface circuit of claim 2, wherein the first impedance circuit further comprises a first load resistor connected to the plurality of first transistors in series, and a second load resistor connected to the plurality of first transistors in parallel, and
    wherein the second impedance circuit further comprises a third load resistor connected to the plurality of second transistors in series, and a fourth load resistor connected to the plurality of second transistors in parallel.

11. The interface circuit of claim 2, wherein the first amplifier circuit further comprises:
    a first resistor connected to the first output node and a common mode feedback node; and
    a second resistor connected to the second output node and the common mode feedback node, and
    wherein a common signal of the first input signal and the second input signal is applied to the common mode feedback node.

12. An interface circuit comprising:
    a first amplifier configured to receive a first input signal and a second input signal, and to output a first output signal and a second output signal, and comprising an impedance circuit connected to nodes outputting the first output signal and the second output signal;
    a second amplifier configured to receive the first output signal and the second output signal, and to output a third output signal;
    a third amplifier configured to receive the third output signal, and to output a fourth output signal and a fifth output signal;
    a code generator circuit configured to generate a control code to adjust an impedance of the impedance circuit; and
    a selection circuit configured to select one of the fourth output signal, the fifth output signal, or an error voltage control signal, and provide the one of the fourth output signal, the fifth output signal, or the error voltage control signal that was selected to the code generator circuit.

13. The interface circuit of claim 12, wherein the impedance circuit comprises:
    a first impedance circuit connected to a first output node configured to output the first output signal; and
    a second impedance circuit connected to a second output node configured to output the second output signal, and
    wherein the code generator circuit comprises:
    a first code generator circuit configured to generate a control code to adjust an impedance of the first impedance circuit; and
    a second code generator circuit configured to generate a control code to adjust an impedance of the second impedance circuit.

14. The interface circuit of claim 13, wherein the selection circuit comprises:
    a first selection circuit configured to provide a first one of the fourth output signal, the fifth output signal, or the error voltage control signal to the first code generator circuit based on a mode selection signal; and
    a second selection circuit configured to provide a second one of the fourth output signal, the fifth output signal, or the error voltage control signal to the second code generator circuit based on the mode selection signal, and
    wherein, when the fourth output signal is provided to the first code generator circuit, the fifth output signal is provided to the second code generator circuit, and
    when the fifth output signal is provided to the first code generator circuit, the fourth output signal is provided to the second code generator circuit.

15. The interface circuit of claim 13, wherein:
    in a noise removal mode, the selection circuit is configured to provide the fourth output signal to the first code generator circuit, and to provide the fifth output signal to the second code generator circuit;
    in an equalization operation, the selection circuit is configured to provide the fifth output signal to the first code generator circuit, and to provide the fourth output signal to the second code generator circuit; and
    in an error voltage correction operation, the selection circuit is configured to provide the error voltage control signal to the first code generator circuit and the second code generator circuit.

16. An operating method of an interface circuit including a first amplifier configured to receive a first input signal and a second input signal and a second amplifier configured to output a first output signal and a second output signal, the operating method comprising:
    receiving a mode selection signal indicating one of a plurality of operation modes;
    selecting one of the first output signal, the second output signal, or an error voltage control signal according to the one of the plurality of operation modes indicated by the mode selection signal;
    adjusting an impedance connected to an output terminal of the first amplifier based on the one of the first output signal, the second output signal, or the error voltage control signal that was selected; and
    generating an output signal of the first amplifier based on the impedance that was adjusted.

17. The operating method of claim 16, wherein the plurality of operation modes comprises a noise removal mode for removing noise in regard to the output signal, an error voltage correction mode for correcting an error voltage in regard to the output signal, or an equalization mode for removing inter-symbol interference of the output signal.

18. The operating method of claim 17, wherein the selecting comprises:
    when the one of the plurality of operation modes is the noise removal mode, selecting the first output signal to control a first impedance circuit connected to a first output terminal of the first amplifier, and selecting the second output signal to control a second impedance circuit connected to a second output terminal of the first amplifier;
    when the one of the plurality of operation modes is the error voltage correction mode, selecting the error voltage control signal to control the first impedance circuit and the second impedance circuit; and
    when the one of the plurality of operation modes is the equalization mode, selecting the second output signal to control the first impedance circuit, and selecting the first output signal to control the second impedance circuit.

19. The operating method of claim 18, wherein the adjusting of the impedance connected to the output terminal of the first amplifier comprises:
    switching respective transistors included in the first impedance circuit and the second impedance circuit based on the one of the first output signal, the second output signal, or the error voltage control signal that was selected.

20. The interface circuit of claim 2, wherein the plurality of first transistors and the plurality of second transistors comprise N-type transistors.

* * * * *